United States Patent
Zagar et al.

[11] Patent Number: 6,097,647
[45] Date of Patent: Aug. 1, 2000

[54] EFFICIENT METHOD FOR OBTAINING USABLE PARTS FROM A PARTIALLY GOOD MEMORY INTEGRATED CIRCUIT

[75] Inventors: Paul S. Zagar; Brent Keeth; Adrian E. Ong, all of Boise, Id.

[73] Assignee: Micron Technology, Inc., Boise, Id.

[21] Appl. No.: 09/382,526

[22] Filed: Aug. 25, 1999

Related U.S. Application Data

[62] Division of application No. 08/993,824, Dec. 18, 1997, Pat. No. 5,970,008, which is a continuation of application No. 08/685,783, Jul. 24, 1996, Pat. No. 5,761,145, which is a continuation of application No. 08/325,766, Oct. 19, 1994, abandoned.

[51] Int. Cl.[7] .................................................. G11C 7/00
[52] U.S. Cl. ............................................. 365/201; 365/226
[58] Field of Search ..................................... 365/226, 201, 365/189.07, 200, 195

[56] References Cited

U.S. PATENT DOCUMENTS

| | | | |
|---|---|---|---|
| 3,762,037 | 10/1973 | Baker et al. | 29/574 |
| 4,799,193 | 1/1989 | Horiguchi et al. | 365/149 |
| 5,235,548 | 8/1993 | Kurkowski | 365/200 |
| 5,235,550 | 8/1993 | Zagar | 365/226 |
| 5,255,234 | 10/1993 | Seok | 365/210 |
| 5,262,993 | 11/1993 | Horiguchi et al. | 365/200 |
| 5,295,101 | 3/1994 | Stephens, Jr. et al. | 365/200 |
| 5,349,559 | 9/1994 | Park | 365/201 |
| 5,396,465 | 3/1995 | Oh et al. | 365/201 |
| 5,400,281 | 3/1995 | Morigami | 365/201 |
| 5,406,520 | 4/1995 | Tay | 365/200 |
| 5,412,594 | 5/1995 | Moyal et al. | 365/96 |
| 5,412,601 | 5/1995 | Sawada et al. | 365/185.06 |
| 5,424,989 | 6/1995 | Hagiwara et al. | 365/201 |
| 5,428,575 | 6/1995 | Fudeyasu | 365/201 |
| 5,465,234 | 11/1995 | Hannai | 365/200 |
| 5,615,162 | 3/1997 | Houston | 365/226 |
| 5,673,232 | 9/1997 | Furutani | 365/226 |
| 5,761,145 | 6/1998 | Zagar et al. | 365/200 X |
| 5,787,044 | 7/1998 | Duesman | 365/200 |
| 5,901,105 | 5/1999 | Ong et al. | 365/230.06 |
| 5,946,257 | 8/1999 | Keeth | 365/226 |

FOREIGN PATENT DOCUMENTS

| | | |
|---|---|---|
| 0283186 | 9/1988 | European Pat. Off. . |
| 0451595 | 10/1991 | European Pat. Off. . |

OTHER PUBLICATIONS

Kitsukawa, G., et al., "WP 3.4: 256 Mb DRAM Technologies for File Applications", 1993 IEEE International Solid-State Circuits Conf., 48,49,261, (1993).

*Primary Examiner*—Do Hyun Yoo
*Attorney, Agent, or Firm*—Schwegman, Lundberg, Woessner & Kluth, P.A.

[57] ABSTRACT

An integrated circuit memory device has multiple subarray partitions which can be independently isolated from the remaining circuitry on the integrated circuit. Subarrays of the integrated circuit can be independently tested. Should a subarray of the integrated circuit be found inoperable it is electrically isolated from the remaining circuitry on the integrated circuit so that it cannot interfere with the normal operation of the remaining circuitry. Defects such as power to ground shorts in a subarray which would have previously been catastrophic can be electrically isolated allowing the remaining functional subarrays to be utilized. Integrated circuit repair by isolation of inoperative elements eliminates the current draw and other performance degradations that have previously been associated with integrated circuits with defects repaired through the incorporation of redundant elements alone.

16 Claims, 5 Drawing Sheets

EFFICIENT METHOD FOR OBTAINING USABLE PARTS FROM A PARTIALLY GOOD MEMORY INTEGRATED CIRCUIT

This application is a divisional of U.S. Ser. No. 08/993,824, filed on Dec. 18, 1997, now U.S. Pat. No. 5,970,008 which is a continuation of U.S. Ser. No. 08/685,783 filed Jul. 24, 1996 now U.S. Pat. No. 5,761,145 which is a continuation of U.S. Ser. No. Ser. No. 08/325,766, filed Oct. 19, 1994, now abandoned.

FIELD OF THE INVENTION

This invention relates to the manufacture and test of semiconductor integrated circuits. The invention is particularly concerned with those types of integrated circuits that incorporate multiple functionally identical elements such as memory bits in a memory device. The invention is further applicable to memory modules that incorporate memory devices manufactured in accordance with the invention. It is also applicable to integrated circuits that integrate numerous functional elements on a single device in which a subset of the functional elements constitutes a viable product.

BACKGROUND OF THE INVENTION

As the device geometries of integrated circuits continue to decrease with improvements in manufacturing processes, greater numbers of circuits can be arrayed on a single integrated circuit die. There is also an increased probability that at least some of these circuits will be defective in some way. It has become standard practice in the design of Dynamic Random Access Memory (DRAM) devices to provide redundant memory elements that can be used to replace defective memory elements and thereby increase device yields. Redundant elements can only be used to repair certain types of defects by replacing a row, a column or a subarray of an array of devices. Depending on the particular defect repaired, the device may exhibit undesirable characteristics such as increased standby current, speed degradation, reduction in operating temperature range, or reduction in supply voltage range as a result of the defect being present on the die. Certain other types of defects cannot be repaired effectively through redundancy techniques alone. Defects such as power to ground shorts in a portion of the array can prevent the device from operating even to the extent required to locate the defect in a test environment. Memory devices with limited known defects have been sold as "partials", "audio RAMs" or "off spec devices" provided that the defects do not prohibitively degrade the performance of the functional portions of the memory. The value of a partially functional device decreases dramatically as the performance of the device deviates from that of the standard fully functional device. The desire to make use of devices with limited defects, and the problems associated with the performance of these devices due to the defects are well known in the industry.

SUMMARY OF THE INVENTION

One embodiment of the invention discloses an integrated circuit memory device which has multiple subarray partitions which can be independently electrically isolated from the remaining circuitry on the integrated circuit. Each of the subarrays of the integrated circuit can be independently tested to verify functionality. The increased testability of these devices provides for greater ease of isolating and solving manufacturing problems. Should a subarray of the integrated circuit be found to be inoperable, it is electrically isolated from the remaining circuitry so that it cannot interfere with the normal operation of the device. Defects such as power to ground shorts in a subarray which would have previously been catastrophic are electrically isolated allowing the remaining functional subarrays to be utilized either as a repaired device or as a memory device of lessor capacity. Integrated circuit repair which includes isolation of inoperative elements eliminates the current draw and other performance degradations that have previously been associated with integrated circuits that repair defects through the incorporation of redundant elements alone. Further, the manufacturing costs associated with the production of a new device of greater integration are recuperated sooner by utilizing partially good devices which would otherwise be discarded. For example, a 256 megabit DRAM with eight subarray partitions could have a number of defective bits that would prevent repair of the device through conventional redundancy techniques. In observance of the teachings of this invention, die on a wafer with defective subarrays are isolated from functional subarrays, and memory devices of lower capacity are recovered for sale as 32, 64, 128 megabit or other capacities.

These lower capacity memory devices are useful in the production of memory modules specifically designed to make use of these devices. For example, a 4 megabit by 36 SIMM module which might otherwise be designed with two 4 megabit by 18 DRAMs of the 64 megabit DRAM generation, are designed with three DRAMs where one or more of the DRAMs is manufactured in accordance with the present invention such as three each 4 megabit by 12 DRAMs. In this case each of the three DRAMs is of the 64 megabit generation, but each has only 48 megabits of functional memory cells. Memory devices of the type described in this specification can also be used in multichip modules, single-in-line packages, on motherboards, etc. It should be noted that this technique is not limited to memory devices such as DRAM, static random access memory (SRAM) and read only memory (ROM, PROM, EPROM, EEPROM, FLASH, etc.). For example, a 64 pin programmable logic array could take advantage of the disclosed invention to allow partial good die to be sold as 28, 32 or 48 pin logic devices by isolating defective circuitry on the die. As another example, microprocessors typically have certain portions of the die that utilize an array of elements such as RAM or ROM as well as a number of integrated discrete functional units. Microprocessors repaired in accordance with the teachings of this invention can be sold as microprocessors with less on board RAM or ROM, or as microprocessors with fewer integrated features. A further example is of an application specific integrated circuit (ASIC) with multiple circuits that perform independent functions such as an arithmetic unit, a timer, a memory controller, etc. It is possible to isolate defective circuits and obtain functional devices that have a subset of the possible features of a fully functional device. Isolation of defective circuits may be accomplished through the use of laser fuses, electrical fuses, other nonvolatile data storage elements, or the programming of control signals. Electrical fuses include circuits which are normally conductive and are programmably opened, and circuits which are normally open and are programmably closed such as antifuses.

One advantage of this invention is that it provides an integrated circuit that can be tested and repaired despite the presence of what would previously have been catastrophic defects. Another advantage of this invention is that it provides an integrated circuit that does not exhibit undesirable electrical characteristics due to the presence of defective elements. An additional advantage of the invention is an increase in the yield of integrated circuit devices since more types of device defects can be repaired. Still another advantage of the invention is that it provides an integrated circuit of decreased size by eliminating the requirement to include large arrays of redundant elements to achieve acceptable manufacturing yields of saleable devices.

BRIEF DESCRIPTION OF THE DRAWINGS

The features of the invention as well as further objects and advantages will be best understood by reference to the appended claims, detailed description of particular embodiments and accompanying drawings where:

FIG. 7 is an electrical schematic diagram of an initialization circuit in accordance with an embodiment of the invention.

DETAILED DESCRIPTION OF THE INVENTION

In accordance with one aspect of the invention, a Dynamic Random Access Memory (DRAM) is produced. The DRAM memory array is partitioned into multiple subarrays each of which has primary power and control signals which can be electrically isolated from other circuitry on the DRAM. Additionally, the DRAM has test circuitry which is used to individually enable and disable each of the memory subarrays as needed to identify defective subarrays. The DRAM also has programmable elements which allow for the electrical isolation of defective subarrays to be permanent at least with respect to the end user of the DRAM. After the DRAM is manufactured, it is tested to verify functionality. If the device is nonfunctional, individual memory subarrays, or groups of subarrays may be electrically isolated from the remaining DRAM circuitry. Upon further test, it may be discovered that one or more memory subarrays are defective, and that these defects result in the overall nonfunctionality of the DRAM. The DRAM is then programmed to isolate the known defective subarrays and their associated circuitry. The DRAM data path is also programmed in accordance with the desired device organization. Other minor array defects may be repaired through the use of redundant memory elements. The resulting DRAM will be one of several possible memory capacities dependent upon the granularity of the subarray divisions, and the number of defective subarrays. The configuration of the DRAM may be altered in accordance with the number of defective subarrays, and the ultimate intended use of the DRAM. For example, in a 256 megabit DRAM with eight input/output data lines (32 megabits×8) and eight subarrays, an input/output may be dropped for each defective subarray. The remaining functional subarrays are internally routed to the appropriate input/output circuits on the DRAM to provide for a DRAM with an equivalent number of data words of lessor bits per word, such as a 32 megabit×5, 6 or 7 DRAM. Alternately, row or column addresses can be eliminated to provide DRAMs with a lessor number of data words of full data width such as a 4, 8 or 16 megabit×8 DRAM.

Figure 1:
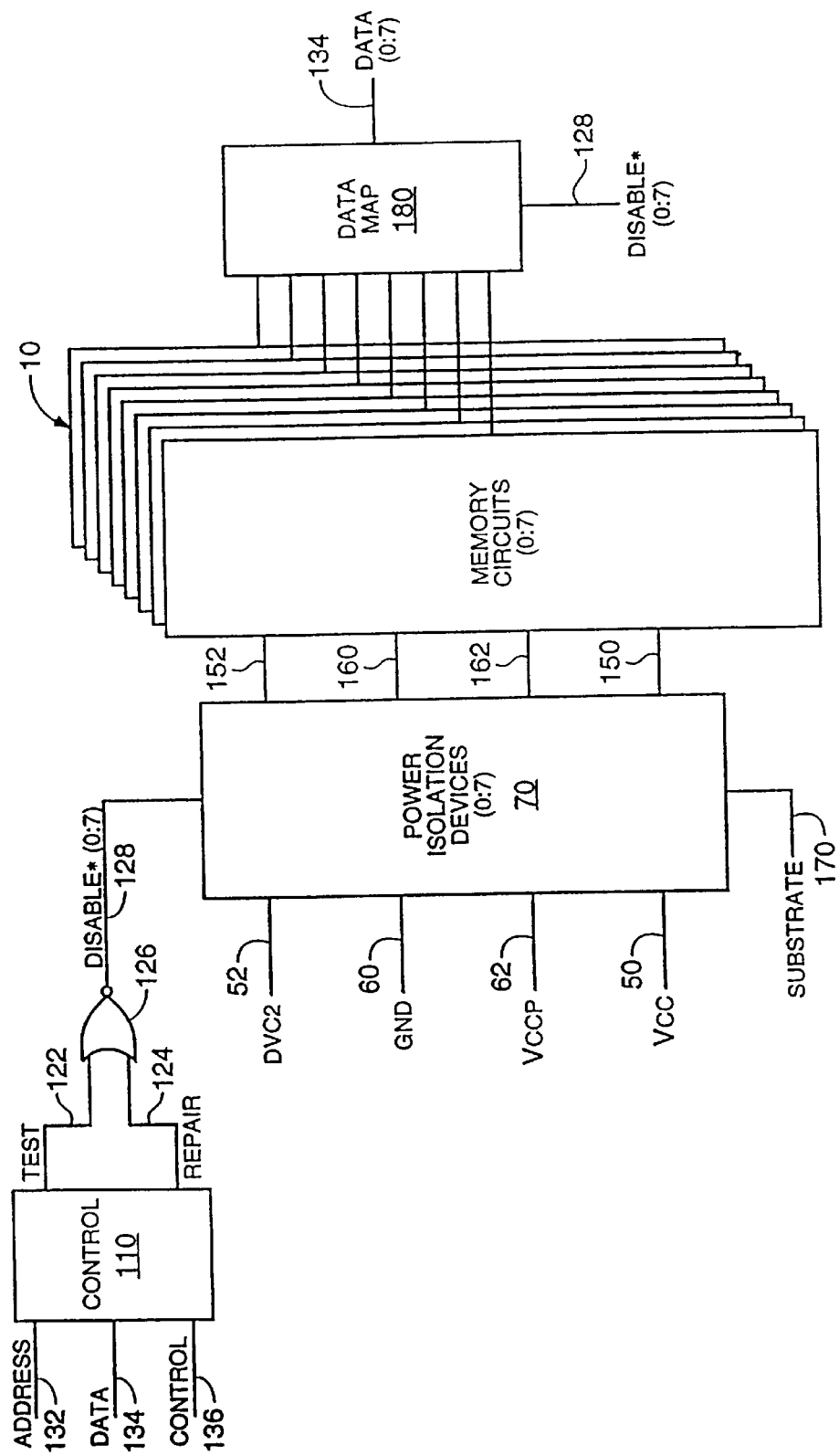
FIG. 1 is an electrical schematic diagram of a memory device in accordance with one embodiment of the invention.

FIG. 1 is a schematic representation of a 256 megabit DRAM designed in accordance with the present invention. The DRAM has eight memory subarrays 10 which are selectively coupled to global signals VCC 50, DVC2 52, GND 60 and VCCP 62. DVC2 is a voltage source having a potential of approximately one half of VCC, and is often used to bias capacitor plates of the storage cells. VCCP is a voltage source greater than one threshold voltage above VCC, and is often used as a source for the word line drivers. Coupling is accomplished via eight isolation circuits 70, one for each subarray 10. The control circuit 110 in addition to generating standard DRAM timing, interface and control signals, generates eight test and eight repair signals 122 and 124. One each of the test and repair signals are combined in each one of eight OR gates 126 to generate a "DISABLE*" active low isolation control 128 for each of the isolation circuits 70 which correspond to the subarrays 10. It may be desirable to include circuitry that monitors current draw of the device and on power up of the device isolates all subarrays in the event that excessive current is drawn by the device. Then in a test mode, the subarrays are individually enabled in order to determine which are defective. Another option is to include a test pad on the device which during test could be used to input a signal that forces all subarrays to be isolated, and allows individual subarrays to be enabled through the use of test signals.

Methods of controlling DRAMs and generating test mode signals from DRAM device ADDRESS 132, DATA 134 and CONTROL 136 signals are well known in the art. The generation of REPAIR signals 124 may be accomplished with the use of laser fuses, electrically programmable fuses or data stored in a nonvolatile memory location such as a FLASH memory register.

Methods of generating appropriate repair signals according to these methods can be accomplished by persons skilled in the art with the aid of the present description.

Individual subarrays of 10 can be isolated during test or repair, and eight each of local signals 150, 152, 160 and 162 which correspond to a local source of VCC, DVC2, GND and VCCP for each subarray 10 when isolated from the global source signals 50 through 62 are coupled to the integrated circuit substrate potential 170. The subarrays of the DRAM can be isolated for test or repair purposes either before or after the integrated circuit is packaged depending on the method of generating the repair signals. If the repair signals are generated through the use of laser fuses, it may not be possible to isolate subarrays after the integrated circuit is packaged. If a combination of laser fuses and other techniques such as electrical fuses are used, then repair through isolation may be accomplished either before or after packaging, or both in the event that further device defects become apparent during testing of a repaired packaged device. The schematic diagram of FIG. 1 represents a DRAM where each subarray corresponds to a single input/output data line of the DATA bus 134. This architecture lends itself to repair through isolation of a subarray and elimination of an input/output data line. For each defective subarray an input/output data line is dropped, and the remaining input/output data lines are mapped to the functional subarrays. Typically, the data lines will be dropped in order of most significant to least significant for each defective subarray. For example, if the subarray that would otherwise be associated with the sixth of eight input/output data lines is isolated due to defects, the eighth data line would be dropped, the sixth data line multiplexed to the seventh subarray, and the seventh data line multiplexed to the eighth subarray. Alternately, the sixth data line could simply be multiplexed to the eighth subarray. This allowsfor a consistent device pin out for all devices of a given data width regardless of which subarrays were isolated.

The data map circuit 180 consists of input/output data path multiplexers which are under the control of the "DISABLE*" signals 128 and reroute the data input/output lines to the appropriate subarrays 10. Methods of multiplexing data lines are well known in the art and are not specifically described in this specification.

Figure 2:
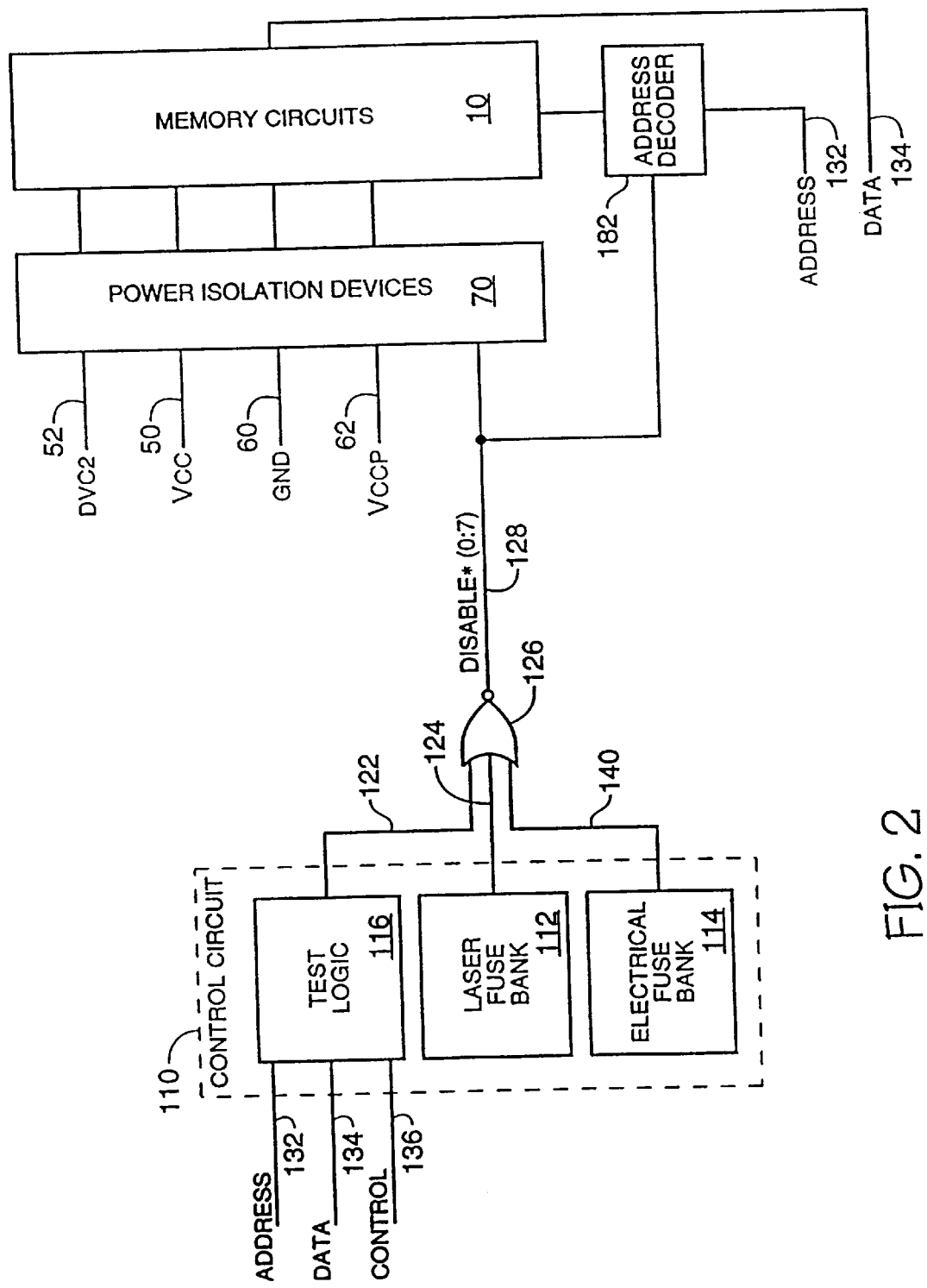
FIG. 2 is an electrical schematic diagram of a memory device in accordance with another embodiment of the invention.

FIG. 2 is a schematic representation of a 64 megabit DRAM which is also designed in accordance with the present invention. The DRAM has eight memory subarrays 10 which are selectively coupled to global signals VCC 50, DVC2 52, GND 60 and VCCP 62. Coupling is accomplished via eight isolation circuits 70, one for each subarray 10. The control circuit 10, in addition to generating standard DRAM timing, interface and control functions, generates eight test signals 122, eight laser fuse repair signals 124 and eight electrical fuse repair signals 140. One each of the test and repair signals are combined in each one of eight logic gates 126 to generate a "DISABLE*" active low isolation control 128 for each of the isolation circuits 70 which correspond to the subarrays 10. A three input OR gate is shown to represent the logic function 126; however, numerous other methods of logically combining digital signals are known in the art. The DRAM of FIG. 2 represents a DRAM where each subarray is tied to multiple input/output data lines of the DATA bus 134. This architecture lends itself to repair through isolation of a subarray and elimination of an address line. When a defective subarray is located, half of the subarrays will be electrically isolated from the global signals 50 through 62, and one address line will be disabled in the address decoder 182. In this particular design the most significant row address is disabled. This provides a 32 megabit DRAM of the same data width as the fully functional 64 megabit DRAM. This is a simplified embodiment of the invention which is applicable to current DRAM designs with a minimum of redesign. Devices of memory capacity other than 32 megabits could be obtained through the use of additional address decode modifications and the isolation of fewer or more memory subarrays. For example, if only a single subarray is defective out of eight possible subarrays on a 64 megabit DRAM, it is possible to design the DRAM so that it can be configured as a 56 megabit DRAM. The address range corresponding to the defective subarray is remapped if necessary so that it becomes the highest address range. In this case, all address lines would be used, but the upper 8 megabits of address space would not be recognized as a valid address for that device, or would be remapped to a functional area of the device. Masking an 8 megabit address range could be accomplished either through programming of the address decoder or through an address decode/mask function external to the DRAM.

Figure 3:
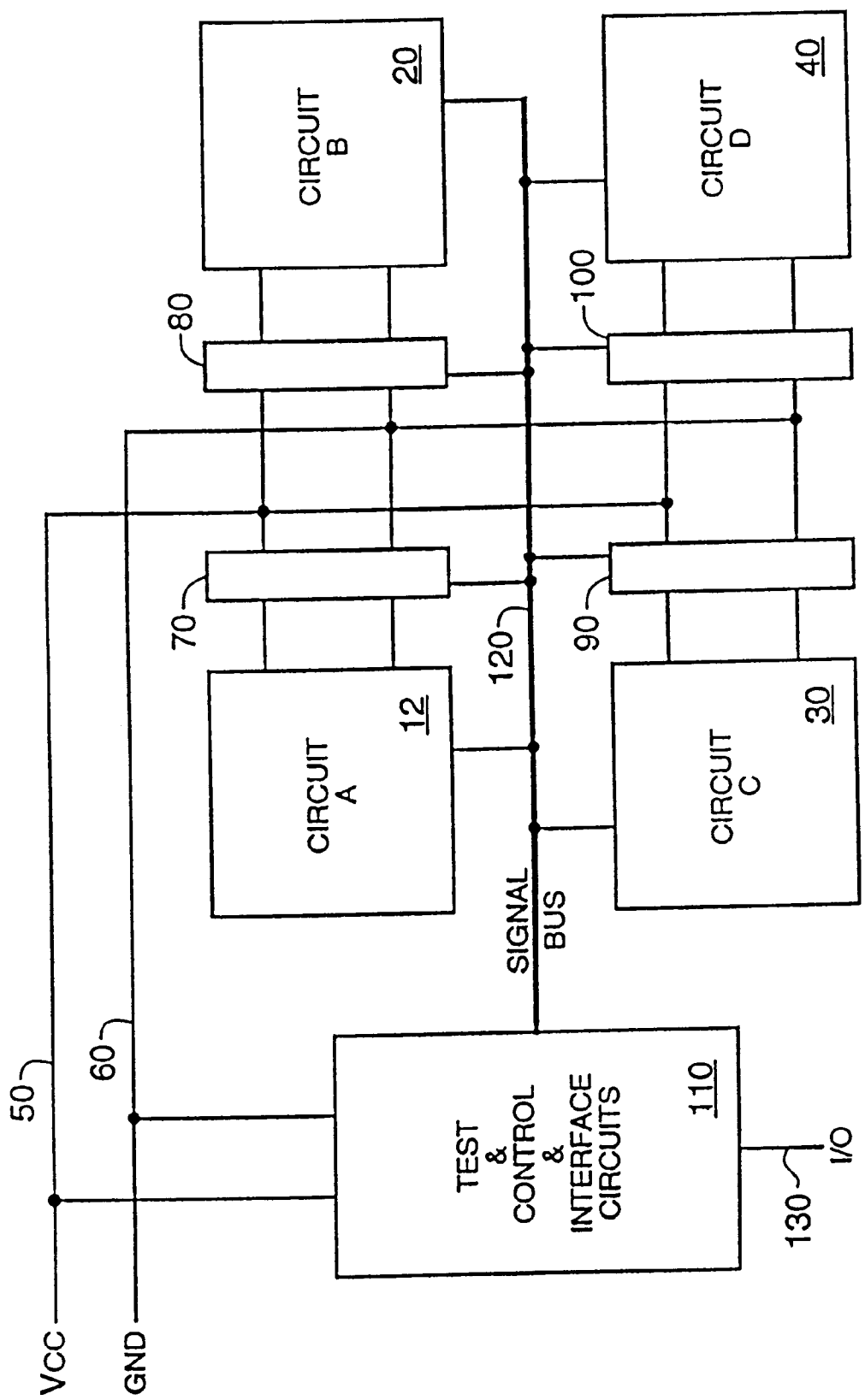
FIG. 3 is an electrical schematic diagram of an integrated circuit according to still another embodiment of the invention.

Referring now to FIG. 3, an integrated circuit is described with multiple functional elements 12,20,30 and 40 which may or may not be functionally identical. VCC 50, and GND 60 connections are provided to the functional elements through isolation devices 70, 80, 90 and 100. The test, control and interface circuit 110 provides control and data signals to and from the functional elements via signal bus 120. After manufacture, the device is placed in a test mode.

Methods of placing a device in a test mode are well known in the art and are not specifically described herein. A test mode is provided to electrically isolate one, some or all of the functional elements 12 through 40 from global supply signals VCC 50 and GND 60 via control signals from 110 over signal bus 120. The capability of individually isolating each of the functional elements 12 through 40 allows ease of test of the control and interface circuits 110, as well as test of each of the functional elements 12 through 40 without interference from possible defective elements of 12 through 40. Circuits that are found defective are repaired if possible through the use of redundant elements. The redundant elements if present may be located either within the functional blocks 12 through 40, or elsewhere on the device. After test and repair, any remaining defective functional elements can be programmably isolated from the global supply signals. The device can then be sold in accordance with the functions that are available. Additional signals such as other supply sources, reference signals or control signals may be isolated in addition to global supply signals VCC and GND. Control signals in particular may be isolated by simply isolating the supply signals to the control signal drivers. Further, it may be desirable to couple the local isolated nodes to a reference potential such as the substrate potential when these local nodes are isolated from the global supply, reference or control signals.

Figure 4:
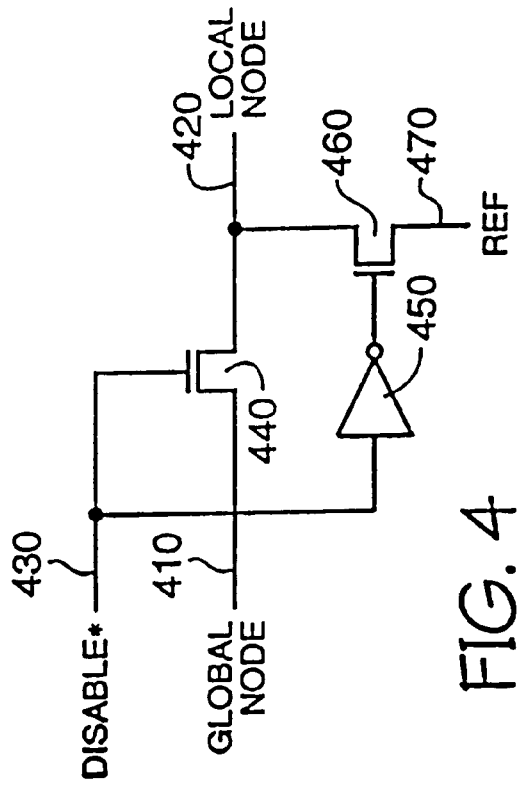
FIG. 4 is an electrical schematic diagram of the power isolation devices of FIGS. 1 through 3.

FIG. 4 shows one embodiment of a single isolation circuit of the type that may be used to accomplish the isolation function of elements 70 through 100 shown in FIGS. 1, 2 and 3. One such circuit is required for each signal to be isolated from a functional element such as elements 12 through 40 of FIG. 3. In FIG. 4, the global signal 410 is decoupled from the local signal 420 by the presence of a logic low level on the disable signal node 430 which causes the transistor 440 to become nonconductive between nodes 410 and 420. Additionally, when the disable node 430 is at a logic low level, invertor 450 causes transistor 460 to conduct between a reference potential 470 and the local node 420. The device size of transistor 440 will be dependent upon the amount of current it will be required to pass when it is conducting and the local node is supplying current to a functioning circuit element. Thus, each such device 440 may have a different device size dependent upon the characteristics of the particular global node 410, and local node 420. It should also be noted that the logic levels associated with the disable signal 430 must be sufficient to allow the desired potential of the global node to pass through the transistor 440 when the local node is not to be isolated from the global node. In the case of an n channel transistor, the minimum high level of the disable signal will typically be one threshold voltage above the level of the global signal to be passed.

Figure 5:
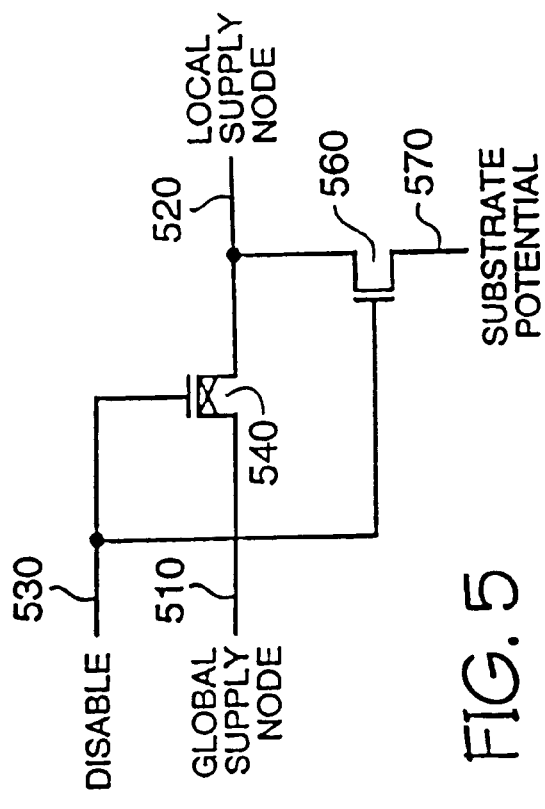
FIG. 5 is an electrical schematic diagram of an alternate embodiment of the power isolation devices of FIGS. 1 through 3.

FIG. 5 shows another embodiment of a single isolation circuit of the type that may be used to accomplish the isolation function of elements 70 through 100 shown in FIGS. 1, 2 and 3. One such circuit is required for each signal to be isolated from a functional element such as elements 12 through 40 of FIG. 3. In FIG. 5, the global signal 510 is decoupled from the local signal 520 by the presence of a logic high level on the disable signal node 530 which causes the transistor 540 to become nonconductive between nodes 510 and 520. Additionally, when the disable node 530 is at a logic high level, transistor 560 will conduct between the device substrate potential 570 and the local node 520. By tying the isolated local nodes to the substrate potential, any current paths between the local node and the substrate, such as may have been caused by a manufacturing defect, will not draw current. In the case of a p channel isolation transistor 540, care must be taken when the global node to be passed is a logic low. In this case the disable signal logic levels should be chosen such that the low level of the disable signal is a threshold voltage level below the level of the global signal to be passed.

Typically a combination of isolation circuits such as those shown in FIGS. 4 and 5 will be used. For example, a p channel isolation device may be desirable for passing VCC, while an n channel isolation device may be preferable for passing GND. In these cases, the disable signal may have ordinary logic swings of VCC to GND. If the global signal is allowed to vary between VCC and GND during operation of the part, then the use of both n channel and p channel isolation devices in parallel is desirable with opposite polarities of the disable signal driving the device gates.

Figure 6:
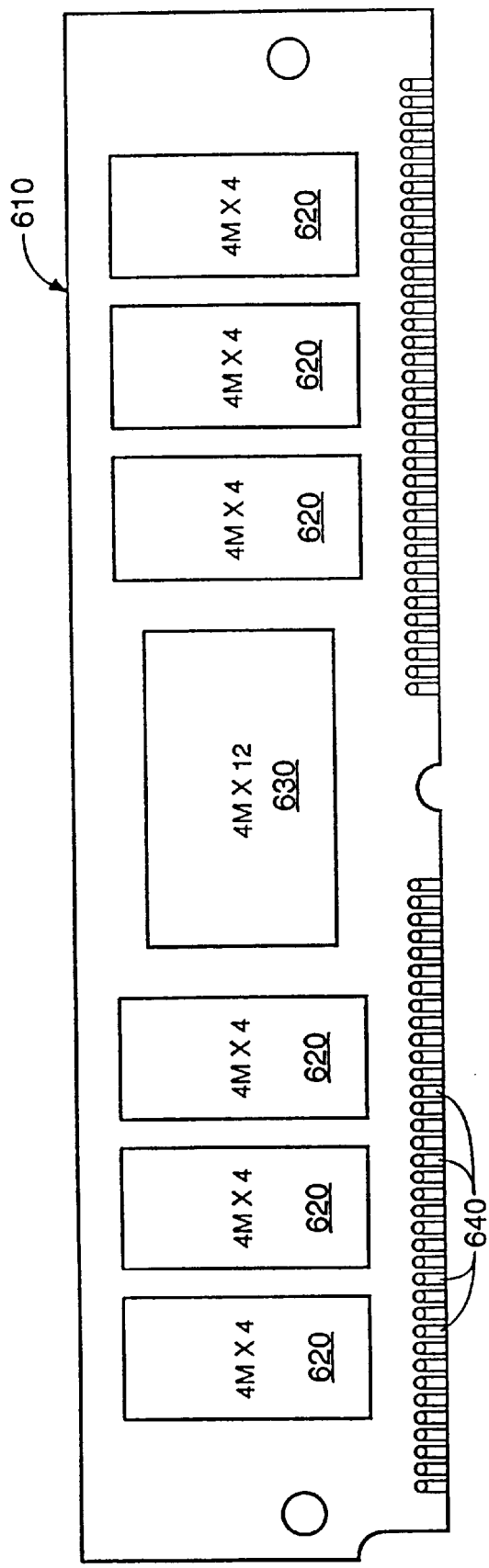
FIG. 6 is an electrical schematic diagram of a memory module in accordance with one embodiment of the invention.

FIG. 6 shows an example of a memory module designed in accordance with the teachings of the present invention. In this case the memory module is a 4 megaword by 36 bit single in line memory module (SIMM) 610. The SIMM is made up of six DRAMs 620 of the sixteen megabit DRAM generation organized as 4 Meg×4's, and one DRAM 630 of the sixty-four megabit generation organized as 4 Meg×12. The 4 Meg×12 DRAM contains one or two defective 4 Meg×2 arrays of memory elements that are electrically isolated from the remaining circuitry on the DRAM 630. In the event that the DRAM 630 has only a single defective 4 Meg×2 array, but a device organization of 4 Meg×12 is desired for use in a particular memory module, it may be desirable to terminate unused data input/output lines on the memory module in addition to isolating the defective array. Additionally, it may be determined that it is preferable to isolate a second 4 Meg×2 array on the memory device even though it is fully functional in order to provide a lower power 4 Meg×12 device. Twenty-four of the data input/output pins on connector 640 are connected to the sixteen megabit DRAMs 620. The remaining twelve data lines are connected to DRAM 630. This SIMM module has numerous advantages over a SIMM module of conventional design using nine 4 M×4 DRAMs. Advantages include reduced power consumption, increased reliability and manufacturing yield due to fewer components, and increased revenue through the use and sale of what may have otherwise been a nonfunctional sixty-four megabit DRAM. The 4 Meg×36 SIMM module described is merely a representation of the numerous possible organizations and types of memory modules that can be designed in accordance with the present invention by persons skilled in the art.

FIG. 7 shows an initialization circuit which when used as part of the present invention allows for automatically isolating defective circuit elements that draw excessive current when an integrated circuit is powered up. By automatically isolating circuit elements that draw excessive current, the device can be repaired before it is damaged. A power detection circuit 710 is used to generate a power-on signal 720 when global supply signal 730 reaches a desired potential. Comparator 740 is used to compare the potential of global supply 730 with local supply 750. Local supply 750 will be of approximately the same potential as global supply 730 when the isolation device 760 couples 730 to 750 as long as the circuit element 770 is not drawing excessive current. If circuit element 770 does draw excessive current, the resistivity of the isolation device 760 will cause a potential drop in the local supply 750, and the comparator 740 will output a high level on signal 780. Power-on signal 720 is gated with signal 780 in logic gate 790 so that the comparison is only enabled after power has been on long enough for the local supply potential to reach a valid level. If signals 800 and 810 are both inactive high, then signal 820 from logic gate 790 will pass through gates 830 and 840 and cause isolation signal 850 to be low which will cause the isolation device 760 to decouple the global supply from the local supply. Isolation signal 800 can be used to force signal 850 low regardless of the output of the comparator as long as signal 810 is high. Signal 800 may be generated from a test mode, or from a programmable source to isolate circuit element 770 for repair or test purposes. Test signal 810 may be used to force the isolation device 760 to couple the global supply to the local supply regardless of the active high disable signal 860. Signal 810 is useful in testing the device to determine the cause of excessive current draw. In an alternate embodiment, multiple isolation elements may be used for isolation device 760. On power up of the chip, a more resistive isolation device is enabled to pass a supply voltage 730 to the circuit 770. If the voltage drop across the resistive device is within a predetermined allowable range, then a second lower resistance isolation device is additionally enabled to pass the supply voltage 730 to circuit 770. This method provides a more sensitive measurement of the current draw of circuit 770. If the voltage drop across the resistive element is above an acceptable level, then the low resistance device is not enabled, and the resistive device can optionally be disabled. If the resistive device does not pass enough current to a defective circuit 770, it is not necessary to disable it, or even to design it such that it can be disabled. In this case a simple resistor is adequate.

Although the present invention has been described with reference to particular embodiments, other versions are possible and will be apparent to individuals skilled in the art. The invention therefore, is not limited to the specific features and elements shown. It is intended that the scope of the invention be defined by the appended claims and in accordance with the doctrine of equivalents.

What is claimed is:

1. A method of testing a memory device, the method comprising:

decoupling a plurality of memory elements from a supply voltage node during a test mode;

selectively coupling each one of the plurality of memory elements to the supply voltage node;

detecting when one of the plurality of memory elements draws a current above a predetermined level; and permanently decoupling the supply voltage node from the detected ones of the plurality of memory elements which draws a current above the predetermined level.

2. The method of claim 1 further comprising disabling an address range of a permanently decoupled one of the plurality of memory elements.

3. The method of claim 2 further comprising remapping the address range which corresponds to the permanently decoupled one of the plurality of memory elements such that the address range corresponds to another of one of the plurality of memory elements.

4. The method of claim 1 further comprising electrically isolating a control signal from the permanently decoupled one of the plurality of memory elements such that defects in the permanently decoupled one of the plurality of memory elements will not affect the control signal.

5. A method of testing an memory device comprising multiple memory elements, the method comprising:

activating isolation devices connected between a supply node and the multiple memory elements to decouple the multiple memory elements from the supply node;

selectively testing the multiple memory elements to detect one of the multiple memory elements that draws a current above a predetermined level; and permanently decoupling the one of the multiple memory elements from the supply node.

6. The method of claim 5 wherein the memory device further comprises circuitry for remapping addresses of the multiple memory elements.

7. The method of claim 5 further comprising:

disabling an address range of the one of the multiple memory elements.

8. The method of claim 5 further comprising:

electrically isolating a control signal from the one of the multiple memory elements such that defects in the one of the multiple memory elements will not affect the control signal.

9. The method of claim 5 wherein the multiple memory elements each comprise a local supply node and selectively testing the multiple memory elements comprises comparing a voltage on the local supply node to a voltage on the supply node.

10. The method of claim 5 wherein permanently decoupling the one of the multiple memory elements comprises programming an antifuse device.

11. A method of testing a memory device comprising first and second memory arrays, the method comprising:

activating a first decoupling device located between the first memory array and an internal power source;

comparing a voltage of a local voltage supply node of the second memory array with a voltage of the internal power source while the first decoupling device is activated; and permanently decoupling the second memory array from the internal power source if the voltage of the local voltage supply node is more than a predetermined voltage below the voltage of the internal power source.

12. The method of claim 11 wherein the method further comprises remapping addresses of the multiple memory elements.

13. The method of claim 12 further comprises disabling an address range of the one of the multiple memory elements.

14. The method of claim 11 further comprising:

electrically isolating a control signal from the one of the multiple memory elements such that defects in the one of the multiple memory elements will not affect the control signal.

15. The method of claim 11 wherein the multiple memory elements each comprise a local supply node and selectively testing the multiple memory elements comprises:

comparing a voltage on the local supply node to a voltage on the supply node.

16. The method of claim 11 wherein permanently decoupling the one of the multiple memory elements comprises programming an antifuse device.

* * * * *